United States Patent [19]

Kimoto

[11] Patent Number: 4,604,729

[45] Date of Patent: Aug. 5, 1986

[54] STATIC-TYPE SEMICONDUCTOR MEMORY DEVICE

[75] Inventor: Masayoshi Kimoto, Kawasaki, Japan

[73] Assignee: Fujitsu Limited, Kawasaki, Japan

[21] Appl. No.: 482,301

[22] Filed: Apr. 5, 1983

[30] Foreign Application Priority Data

Apr. 12, 1982 [JP] Japan ................................ 57-59763

[51] Int. Cl.⁴ ............................................. G11C 11/40
[52] U.S. Cl. .................................... 365/190; 365/202
[58] Field of Search ............... 365/189, 190, 202, 203

[56] References Cited

U.S. PATENT DOCUMENTS 4,369,502  1/1983  Isogai .............................. 365/190 X Primary Examiner—Joseph A. Popek
Attorney, Agent, or Firm—Staas & Halsey

[57] ABSTRACT

A static-type semiconductor memory device having a holding-current controlling circuit such that the holding current supplied to an unselected-state memory block or memory chip is greater than the holding current supplied to a selected-state memory block or memory chip. The current supplied to the peripheral circuit for the unselected-state memory block or memory chip is smaller than the current supplied to the peripheral circuit for the selected-state memory block or memory chip, whereby destruction of stored data can be prevented.

17 Claims, 3 Drawing Figures

STATIC-TYPE SEMICONDUCTOR MEMORY DEVICE

BACKGROUND OF THE INVENTION

(1) Field of the Invention

The present invention relates to a semiconductor memory device, more particularly, to a static-type semiconductor memory device in which the danger of destruction of the stored data due to alpha particles or power supply noise is reduced.

(2) Description of the Prior Art

Generally, a static-type semiconductor memory device comprises a memory cell array consisting of a plurality of memory cells, a peripheral circuit for the memory cell array, and a holding-current supplying circuit. The static-type memory cell comprises cross-coupled transistors which constitute a flip-flop. The data storing capacity of the memory cell is expressed by $\frac{1}{2}CV$, where C is the amount of the stored charges, and V is the base-base voltage when the above-mentioned transistors, are bipolar transistors or the gate-gate voltage when the above-mentioned transistors are metal-insulator semiconductor (MIS) transistors. The data stored in each memory cell can theoretically be held by continuously supplying a holding current to each memory cell.

However, it is known that, when a semiconductor memory device is assembled into a package, the data stored in the semiconductor memory device are often destroyed due to alpha particles radiated from the package. The stored data may also be destroyed due to power supply noise, i.e., fluctuations of the power supply voltage. Therefore, countermeasures for alpha particles and power supply noise are required.

To obtain a semiconductor memory device resistant to alpha particles and power supply noise, it may be considered to increase the data storing capacity of each memory cell by increasing the above-mentioned C and V. Increase of the C and V of all the memory cells, however, would reduce the switching speed, resulting in an undesirably slower writing speed or reading speed. It may also be considered to increase the data storing capacity by increasing the holding current. Conventionally, however, the same holding currents are supplied to both unselected-state memory IC's and selected-state memory IC's. Therefore, the unselected-state memory cells and the selected-state memory cells have the same C and V. If the holding currents are increased in the conventional device, the C and V for all the memory cells are also increased, resulting in the reduced writing or reading speed.

SUMMARY OF THE INVENTION

An object of the present invention is to provide a static-type semiconductor memory device in which the danger of destruction of the stored data by alpha particles or power supply noise is reduced.

Another object of the present invention is to provide a static-type semiconductor memory device in which the C and V in each memory cell in unselected memory IC's are made greater than those in each memory cell in selected memory IC's.

Still another object of the present invention is to provide a static-type semiconductor memory device in which the holding current flowing through the memory cells in selected-state memory IC's is greater than the holding current flowing through the memory cells in unselected-state memory IC's.

To attain the above object, there is provided, according to the present invention, a static-type semiconductor memory device comprising a plurality of memory blocks arranged in a row direction and in a column direction to form a matrix. Any one row of the memory blocks is operatively selected to carry out a reading or writing operation in the selected memory blocks. Each of the memory blocks comprises a memory cell array including memory cells, and a peripheral circuit associated with the memory cell array. The peripheral circuit comprises a holding-current supplying circuit for supplying, to the memory blocks, a current for holding data stored in the memory cells, a first current-source circuit for supplying currents through bit lines to the memory cells, a sense amplifier circuit for detecting potential differences between the bit lines, and a second current-source circuit for supplying currents to the sense amplifier circuit. According to the present invention, each of the memory blocks further comprises a holding-current controlling circuit for controlling the holding-current supplying circuit such that the holding current supplied to an unselected-state memory block is greater than the holding current supplied to a selected-state memory block. The current supplied to the first current-source circuit, the sense amplifier, and the second current-source circuit, associated with an unselected-state memory block is smaller than the current supplied to the first current-source circuit, the sense amplifier, and the second current-source circuit, associated with a selected-state memory block.

According to one aspect of the present invention, the holding-current controlling circuit comprises a differential amplifier for determining whether the memory block is selected or not. The differential amplifier operatively outputs a holding-current determining signal. The holding-current determining signal has a first potential when the memory block is selected and a second potential when the memory block is unselected. The holding-current determining signal is operatively applied to the holding-current supplying circuit so as to activate the holding-current supplying circuit in response to only the first potential.

According to a further aspect of the invention, the differential amplifier operatively outputs a current-source current determining signal having the first potential or the second potential when the holding-current determining signal has the second potential or the first potential, respectively. The current-source current determining signal is applied to the first current source and the second current source so as to activate the current sources in response to the potential of the current-source current determining signal.

According to a still further aspect of the invention, each of the memory cells is connected between a word line and a hold line. The word line and the hold line are extended in the row direction. The holding current is conducted from the word line through the memory cell to the hold line. Each of the memory cells is connected between a pair of bit lines extending in the column direction. The holding-current supplying circuit comprises a plurality of first NPN transistors each having a base adapted to receive the holding-current determining signal from the differential amplifier, a collector connected to the hold line, and an emitter connected to a first power supply.

According to a still further aspect of the invention, the first current source and the second current source comprise second NPN transistors each having a base adapted to receive the current-source current determining signal.

According to a still further aspect of the invention, the differential amplifier comprises a third NPN transistor having a base adapted to receive a reference signal, a collector connected through a resistor to a second power supply, and an emitter connected to a current source; and a fourth NPN transistor having a base adapted to receive a block selecting signal, a collector connected through a resistor to the second power supply, and an emitter connected to the current source. The collector of the third NPN transistor is adapted to provide the holding-current determining signal. The collector of the fourth NPN transistor is adapted to provide the current-source current determining signal.

Each of the memory blocks may be one memory chip. Alternatively, a predetermined number of the memory blocks may comprise one memory chip.

The above objects and advantages as well as other features of the present invention will be apparent from the following description of the preferred embodiments with reference to the accompanying drawings.

DESCRIPTION OF THE PREFERRED EMBODIMENTS

An embodiment of the present invention will now be described with reference to the drawings.

Figure 1:
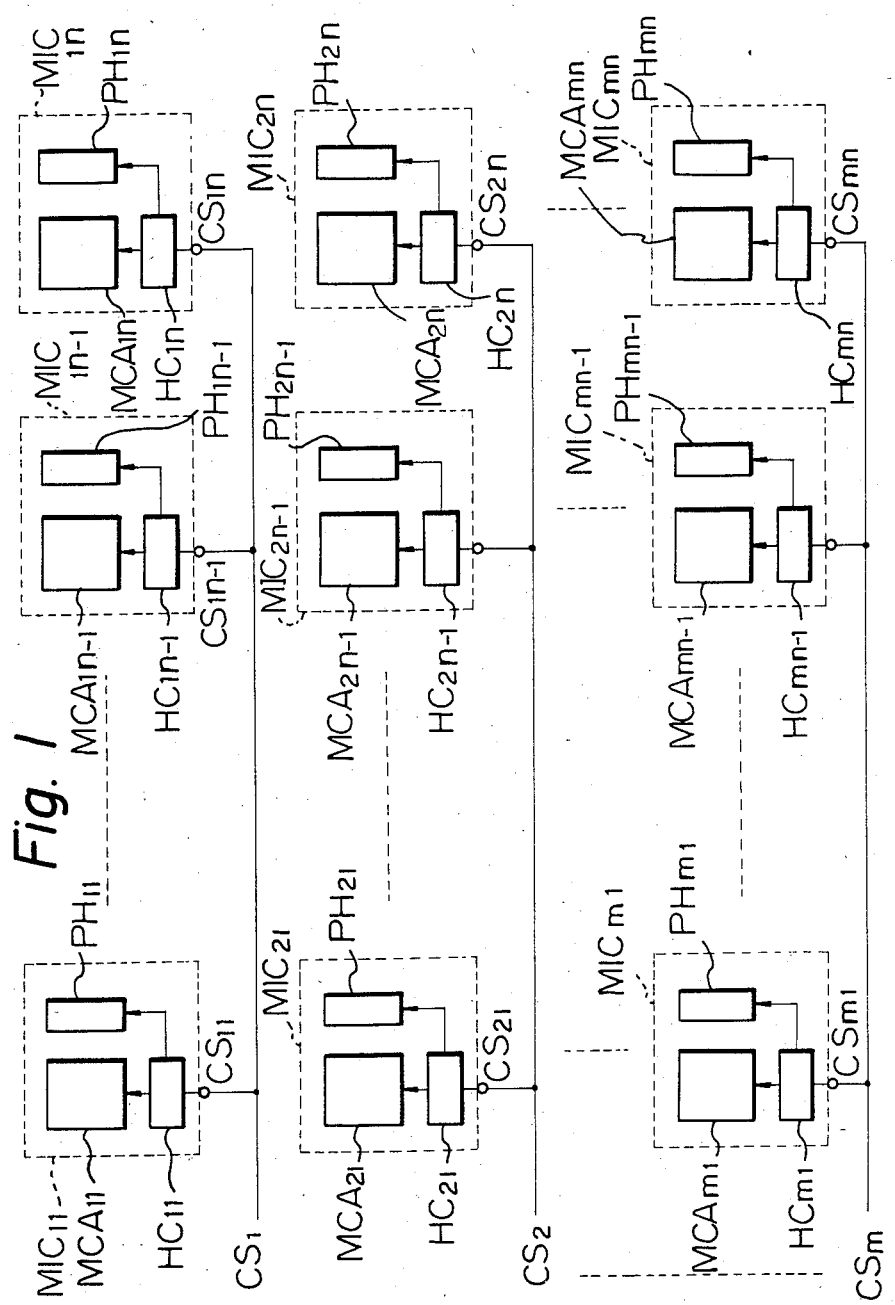
FIG. 1 is a general block diagram of a semiconductor memory device according to an embodiment of the present invention.

FIG. 1 is a general block diagram of an embodiment of the present invention. In the figure, $MIC_{11}$ through $MIC_{mn}$ are memory IC chips; $MCA_{11}$ through $MCA_{mn}$ are memory cell arrays; $PH_{11}$ through $PH_{mn}$ are peripheral circuits of the memory cell arrays; $HC_{11}$ through $HC_{mn}$ are holding-current controlling circuits; $CS_{11}$ through $CS_{mn}$ are chip-selecting terminals; and $CS_1$ through $CS_m$ are chip-selecting signals. Each static-type semiconductor memory IC chip comprises a memory cell array, a peripheral circuit, and a holding-current controlling circuit for controlling the holding current supplied to the memory cell array and the current supplied to the peripheral circuit. That is, when a memory IC chip is in a selected state, i.e., when the chip-selecting signal applied to the chip-selecting terminal is at a low level, the ratio between the holding current supplied to the memory cells in the chip and the current supplied to the peripheral circuit in the chip is the same as the ratio in conventional devices. When the memory IC chip is in an unselected state, i.e., when the chip-selecting signal is at a high level, the holding current supplied to the memory cells is increased, and the current supplied to the peripheral circuit is decreased. The total power consumption in all of the memory IC chips is thus either constant or decreased. Thus, almost no data stored in the unselected-state memory cells are destroyed because of the increased holding currents.

The operation of the circuit of FIG. 1 will now be described. When the chip-selecting signal $CS_1$ becomes the low level (L) so that the memory IC chips $MIC_{11}$, ---, and $MIC_{1n}$ in the first row are turned to the selected states, the holding current flowing through the memory cell arrays $MCA_{11}$, ---, and $MCA_{1n}$ and the current flowing through the peripheral circuits in the first row are the same as the holding current in conventional devices. However, the holding current flowing through the memory cell arrays $MCA_{21}$, ---, $MCA_{2n}$, ---, $MCA_{mn}$ in and after the unselected-state second row, becomes greater than the holding current in the selected state. Also, the current flowing through the peripheral circuits $PH_{21}$, ---, $PH_{2n}$, ---, and $PH_{mn}$ in and after the second row becomes smaller than the current flowing through the selected-state peripheral circuits, as described in detail later. Since no writing or reading operation is carried out in the unselected-state memory IC chips, the operating speed is not reduced even when the holding current supplied to the unselected memory IC chips is increased. Also, since the peripheral circuit does not operate in the unselected state, the current supplied to the peripheral circuit in the unselected memory IC chip can be decreased without any trouble.

Figure 2:
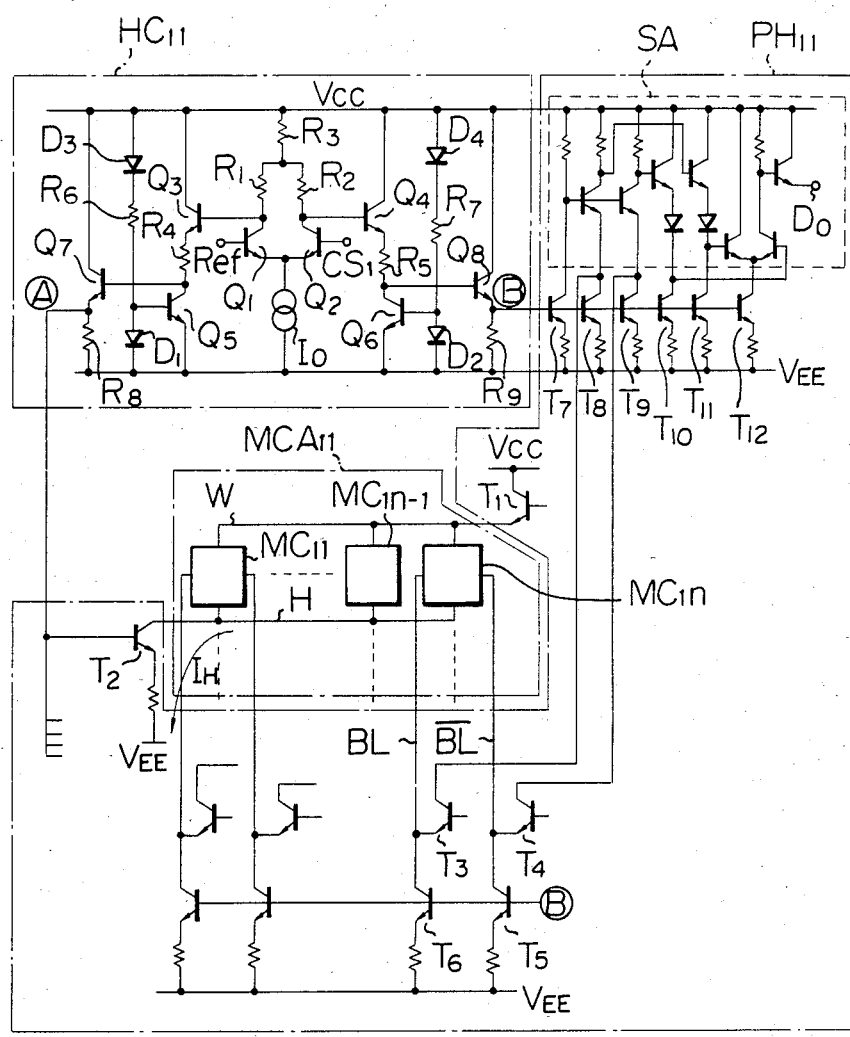
FIG. 2 is a circuit diagram of one of the memory IC chips in the block diagram of FIG. 1, the memory IC chip including a memory cell array, a peripheral circuit, and a holding-current controlling circuit.

FIG. 2 is a circuit diagram of one of the memory IC chips $MIC_{11}$ in the block diagram of FIG. 1. The memory IC chip $MIC_{11}$ includes the memory cell array $MCA_{11}$, its peripheral circuit $PH_{11}$, and the holding-current controlling circuit $HC_{11}$. In FIG. 2, the memory cell array $MCA_{11}$ and the peripheral circuit $PH_{11}$ have well known constructions. In brief, the memory cell array $MCA_{11}$ has bipolar memory cells $MC_{11}$, ---, $MC_{1n}$, --- arranged in a matrix. The peripheral circuit $PH_{11}$ includes a word-line driving transistor $T_1$ and a holding-current supplying transistor $T_2$ for each row of the memory cell array, bit-line level detecting transistors $T_3$ and $T_4$, transistors $T_5$ and $T_6$ for supplying currents to the bit lines BL and $\overline{BL}$, and a well-known sense amplifier SA, for each column of the memory cell array. The detected levels of the bit lines BL and $\overline{BL}$ are amplified to obtain the read-out data at output terminal $D_0$. Transistors $T_7$ through $T_{12}$ in the peripheral circuit $PH_{11}$ are transistors for a current source for the sense amplifier. For the sake of simplicity, the other sense amplifiers for the memory cells $MC_{11}$ through $MC_{1n-1}$ and their peripheral circuits are eliminated in the drawing.

The holding-current controlling circuit $HC_{11}$, provided according to the present invention, comprises a pair of NPN transistors $Q_1$ and $Q_2$. Reference voltage Ref is applied to the base of the transistor $Q_1$. A chip-selecting signal $CS_1$ is applied to the base of the transistor $Q_2$. The emitters of the transistors $Q_1$ and $Q_2$ are commonly connected to a current source $I_0$. The collectors of the transistors $Q_1$ and $Q_2$ are respectively connected via resistors $R_1$ and $R_2$ to one end of the resistor $R_3$, the other end of the resistor $R_3$ being connected to a power supply line $V_{CC}$. The collectors of the transistors $Q_1$ and $Q_2$ are also connected to the bases of NPN transistors $Q_3$ and $Q_4$, respectively. The collectors of the transistors $Q_3$ and $Q_4$ are connected to the power supply line $V_{CC}$. The emitters of the transistors $Q_3$ and $Q_4$ are respectively connected via resistors $R_4$ and $R_5$ to the collectors of NPN transistors $Q_5$ and $Q_6$. The emitters of the transistors $Q_5$ and $Q_6$ are connected to the ground supply line $V_{EE}$. The bases of the transistors $Q_5$ and $Q_6$ are respectively clamped by diodes $D_1$ and $D_2$. That is, the anodes of the diodes $D_1$ and $D_2$ are respectively connected to the bases of the transistors $Q_5$ and $Q_6$, and the cathodes of the diodes $D_1$ and $D_2$ are connected to the ground supply line $V_{EE}$. Also, the anodes of the diodes $D_1$ and $D_2$ are respectively connected via resistors $R_6$ and $R_7$ to the cathodes of diodes $D_3$ and $D_4$. The anodes of the diodes $D_3$ and $D_4$ are connected to the power supply line $V_{CC}$. The collectors of the transistors $Q_5$ and $Q_6$ are also connected to the bases of transistors $Q_7$ and $Q_8$, respectively. The collectors of the transistors $Q_7$ and $Q_8$ are connected to the power supply line $V_{CC}$, and the emitters of the transistors $Q_7$ and $Q_8$ are connected via resistors $R_8$ and $R_9$, respectively, to the ground supply line $V_{EE}$. The emitter Ⓐ of the transistor $Q_7$ is also connected to the base of the holding-current supplying transistor $T_2$ in the memory cell array $MCA_{11}$. The emitter Ⓑ of the transistor $Q_8$ is connected to the bases of the transistors $T_7$ through $T_{12}$ and to the bases of the current-source transistors such as the transistors $T_5$ and $T_6$ for the bit lines.

The operation of the circuit of FIG. 2 will now be explained.

Normally, when the potential of the chip-selecting signal $CS_1$ is at the H level, which is higher than the reference voltage Ref, the memory IC chips $MIC_{11}$, ---, and $MIC_{1n}$ in the first row as shown in FIG. 1 are in the unselected state. In this state, with respect to the memory IC chip $MIC_{11}$, the transistor $Q_1$ is off, and the transistor $Q_2$ is on. Accordingly, the base level of the transistor $Q_3$ is at the H level, and the base level of the transistor $Q_4$ is at the L level. Thus, the collector level of the transistor $Q_5$ or the base level of the transistor $Q_7$ becomes the H level, and the collector level of the transistor $Q_6$ or the base level of the transistor $Q_8$ becomes the L level. Thus, the potential at the emitter Ⓐ of the transistor $Q_7$ becomes the H level, and the potential at the emitter Ⓑ of the transistor $Q_8$ becomes the L level. Accordingly, to the base of the holding-current supplying transistor $T_2$ in the memory cell array $MCA_{11}$, the H level voltage is applied to turn on the transistor $T_2$ so that a large holding current $I_H$ flows from the word line W through the memory cells $MC_{11}$ through $MC_{1n}$ and through the transistor $T_2$ to the ground supply line $V_{EE}$. On the other hand, since the L level potential is applied to the bases of the current source transistors $T_7$ through $T_{12}$ and to the bases of the bit-line current source transistors $T_5$, $T_6$, ---, the transistors $T_5$ through $T_{12}$ are turned off so that the current flowing through the peripheral circuit $PH_{11}$ is decreased. By setting the holding current for the unselected-state memory cells and the current for the peripheral circuit to the appropriate values so that the increase in the power consumption due to the increase of the holding current is compensated for or decreased by the decrease in the power consumption due to the decreased current flowing through the peripheral circuit, the total power consumption in the memory IC chip $MIC_{11}$ is constant regardless of its selected state or unselected state, or may be decreased in comparison with its selected state.

It is apparent that, when the chip-selecting signal $CS_1$ is lower than the reference voltage Ref, an inverse of the above-described operation is carried out. That is, the holding current for the selected-state memory cells is decreased, and the current for the peripheral circuit is increased.

Figure 3:
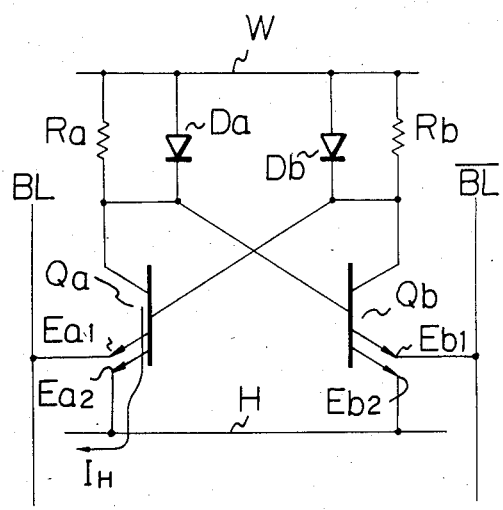
FIG. 3 is an equivalent circuit diagram of an example of a well-known bipolar memory cell.

The reason for the increased data-holding capacity of a memory cell due to the increased holding current $I_H$ will now be described with reference to FIG. 3. FIG. 3 is an equivalent circuit diagram of an example of a well-known bipolar memory cell. In FIG. 3, the memory cell MC comprises, as is well known, a pair of multi-emitter NPN transistors $Q_a$ and $Q_b$, a load resistor $R_a$ and a clamping diode $D_a$ connected in parallel between the collector of the transistor $Q_a$ and the word line $W_+$, and a load resistor $R_b$ and a clamping diode $D_b$ connected in parallel between the the collector of the transistor $Q_b$ and the word line $W_+$. The first emitters $E_{a1}$ and $E_{b1}$ of the transistors $Q_a$ and $Q_b$ are connected to the bit lines BL and $\overline{BL}$, respectively. The emitters $E_{a1}$ and $E_{b1}$ are referred to as detecting emitters. The second emitters $E_{a2}$ and $E_{b2}$ are connected to a hold line H. The emitters $E_{a2}$ and $E_{b2}$ are referred to as holding emitters. As long as the voltage between both ends of the resistor $R_a$ or $R_b$ is smaller than the clamping voltage of the diode $D_a$ or $D_b$, a current flows through the resistor $R_a$ or $R_b$. When the transistor $Q_a$ is in an on state and the transistor $Q_b$ is in an off state, a current nearly equal to the holding current $I_H$ flows through the resistor $R_a$, while almost no current flows through the resistor $R_b$. Therefore, the base potential of the transistor $Q_a$ is nearly equal to the potential $V_W$ of the word line W, and the base potential of the transistor $Q_b$ is $V_W - I_H \cdot R$ (where R is the resistance of the resistor $R_a$). Accordingly, the potential difference V between the bases of the transistors $Q_a$ and $Q_b$ can be expressed as follows: $V = V_W - (V_W - I_H \cdot R) = I_H \cdot R$. The greater the holding current $I_H$, the greater the potential difference V between the bases. Since the data holding capacity can be expressed by $\frac{1}{2}CV$, as described before, the data holding capacity of each memory cell in the unselected memory IC chips is increased by increasing the holding current $I_H$.

It should be noted that a PNPN-type memory cell is also known. In place of the load resistors, the PNPN-type type memory cell uses diodes as the loads. Each of the diodes is formed between the emitter and the base of a PNP transistor. In the PNPN-type memory cell, the voltage drop between the ends of the load is not increased even when the holding current is increased. Accordingly, the potential difference between the bases of the transistors which comprise the flip-flop is not increased. However, in this case, when the holding current $I_H$ is increased, the depletion layer of the load PNP transistor is narrowed due to the increase in the forward-direction bias current. Therefore, the capacitance C is increased, and, thus, the data holding capacity $\frac{1}{2}CV$ is also increased.

The above explanation has been made with reference to examples using bipolar transistors in memory cells. However, it will be apparent to those skilled in the art that the present invention is also applicable to a static-type semiconductor memory device using MIS transistors. Also, the above explanation described the holding current as being increased when the memory IC is unselected. Alternatively, the memory cell array in the memory IC may be separated into several blocks, and the holding current in the unselected-block memory cells may be increased and the supplying current to its peripheral circuit may be decreased.

From the foregoing description, it will be apparent that, according to the present invention, by making the holding current flowing through unselected-state memory IC chips greater than that flowing through selected-state IC chips, the data holding capacity of the memory cells in unselected-state memory IC chips, the number of which is usually large, can be increased. Accordingly, the danger of destruction of the stored data in the memory cells due to alpha rays or power-supply noise fluctuation is reduced.

I claim:

1. A static-type semiconductor memory device comprising:
   a plurality of memory blocks, arranged in rows and columns to form a matrix, having selected and unselected states, any one row of the memory blocks being selected to carry out a reading or writing operation in the selected memory blocks, each of said memory blocks comprising:
   a memory cell array including memory cells;
   a peripheral circuit operatively connected to said memory cell array, said peripheral circuit comprising:
      a holding current supplying circuit, operatively connected to said memory cell array, for supplying a holding current for holding data stored in said memory cells;
      bit lines operatively connected to said memory cells;
      a first current-source circuit, operatively connected to said bit lines, for supplying currents to said bit lines;
      a sense amplifier circuit, operatively connected to said bit lines, for detecting potential differences between said bit lines; and
      a second current-source circuit, operatively connected to said sense amplifier circuit, for supplying currents, other than those supplied by said first current-source circuit, to said sense amplifier circuit; and
      a holding-current controlling circuit, operatively connected to said peripheral circuit and said holding-current supplying circuit, for controlling said holding-current supplying circuit such that the holding-current supplied to an unselected-state memory block is greater than the holding-current supplied to a selected-state memory block, and such that the currents supplied from said first current-source circuit to said bit lines and the currents supplied from said second current-source circuit to said sense amplifier, assoicated with an unselected-state memory block, are smaller than the currents supplied from said first current-source circuit to said bit lines and the currents supplied from said second current-source circuit to said sense amplifier, associated with the selected-state memory block.

2. A static-type semiconductor memory device as set forth in claim 1, wherein said holding-current controlling circuit comprises a differential amplifier for determining whether the memory block is selected or not, said differential amplifier outputting a holding-current determining signal, said holding-current determining signal having a first potential when the memory block is selected and having a second potential when the memory block is unselected, said holding-currrent determining signal being supplied to said holding-current supplying circuit so as to activate said holding-current supplying circuit in response to only said first potential.

3. A static-type semiconductor memory device as set forth in claim 2, wherein said differential amplifier outputs a current-source current determining signal having said first potential when said holding-current determining signal has said second potential and having said second potential when said holding-current determining signal has said first potential, respectively, said current-source current determining signal being supplied to said first current-source and said second current-source, so as to activate said first and second current-source in response to the potential of said current-source current determining signal.

4. A static-type semiconductor memory device as set forth in claim 3, further comprising word lines and hold lines, wherein each of said memory cells is connected between one of said word lines and one of said hold lines, said word lines and hold lines extending in the row direction, said holding-current being conducted from each of said word lines through said memory cells to said hold lines, wherein each of said memory cells is operatively connected between a pair of bit lines extending in said column direction and wherein said holding-current supplying circuit comprises a plurality of first NPN transistors each having a base operatively connected to said differential amplifier, for receiving said holding-current determining signal, having a collector connected to one of said hold lines, and having an emitter connected to a first power supply.

5. A static-type semiconductor memory device as set forth in claim 4, wherein said first current-source circuit and said second current-source circuit comprise second NPN transistors each having a base operatively connected to receive said current-source current determining signal.

6. A static-type semiconductor memory device, operatively connected to receive a reference signal and a block selecting, as set forth in claim 5, wherein said differential amplifier comprises:
   a third NPN transistor having a base operatively connected to receive the reference signal, a collector operatively connected to a second power supply, and an emitter;
   a first resistor operatively connected between said second power supply and said collector of said third NPN transistor;
   a current-source operatively connected to said emitter of said third NPN transistor;
   a fourth NPN transistor having a base operatively connected to receive the block selecting signal, a collector operatively connected to said second power supply, and an emitter operatively connected to said current source;
   a second resistor operatively connected between said collector of said fourth NPN transistor and said second power supply;
   wherein said collector of said third NPN transistor provides said holding-current determining signal to said differential amplifier, and wherein said collector of said fourth NPN transistor provides said current-source current determining signal to said differential amplifier.

7. A static-type semiconductor memory device as set forth in claim 6, wherein each of said memory blocks is a memory chip.

8. A static-type semiconductor memory device as set forth in claim 6, wherein a predetermined number of said memory blocks comprise a memory chip.

9. A static-type semiconductor memory device comprising:
   a plurality of memory blocks, arranged in rows and columns to form a matrix, having selected and unselected states, said selected state memory blocks having a first holding-current and said unselected-state memory blocks having a second holding-current, any row of the memory blocks being selected to carry out a reading or writing operation in said selected-state memory blocks, each of said memory block comprising:
a memory cell array including memory cells;
a peripheral circuit operatively connected to said memory cell array, said peripheral circuit comprising:
  a holding-current supplying circuit, operatively connected to said memory cell array, for supplying the first and second holding-currents for holding data stored in said memory cells;
  bit lines operatively connected to said memory cells;
  a first current-source circuit, operatively connected to said bit lines, for supplying a first current to said bit lines of said selected memory cells;
  a sense amplifier circuit, operatively connected to said bit lines, for detecting potential differences between said bit lines; and
  a second current-source circuit, operatively connected to said sense amplifier circuit, for supplying the second current to said sense amplifier circuit of said unselected memory cells; and
  a holding-current controlling circuit, operatively connected to said peripheral circuit and said holding-current supplying circuit, for controlling said holding-current supplying circuit such that the second holding-current is greater than the first holding-current and the second current is less than the first current.

10. A static-type semiconductor memory device, having a selected-state or unselected-state in accordance with a selection signal, comprising:
a memory cell array including memory cells;
holding-current supply means, operatively connected to said memory cell array, for supplying a holding-current to said memory cell array for holding data stored in said memory cells;
peripheral circuit means, operatively connected to said memory cell array, for operating with said memory cell array during the selected-state;
current-source circuit means, operatively connected to said peripheral current means, for supplying a peripheral current to said peripheral circuit means; and
current control means, operatively connected to said holding-current supply means and said current-source circuit means, and operatively connected to receive the selection signal, for controlling said holding-current supply means and said current-source circuit means in accordance with the selection signal such that said holding-current during the unselected-state is greater than said holding-current during the selected-state, and such that said peripheral current during the unselected-state is smaller than said peripheral current during the selected-state.

11. A static-type semiconductor memory device as set forth in claim 10, wherein said current control means comprises a differential amplifier for determining whether said memory cell array is selected or unselected, said differential amplifier outputting a current control determining signal, said current control determining signal having a first potential when said memory cell array is selected and having a second potential when said memory cell array is unselected, said current control determining signal being supplied to said holding-current supply means so as to activate said holding-current supply means in response to only said first potential.

12. A static-type semiconductor memory device as set forth in claim 11, wherein said differential amplifier outputs a current-source current determining signal having said first potential when said current control determining signal has said second potential and having said second potential when said current control determining signal has said first potential, respectively, said current-source current determining signal being supplied to said current-source circuit means, so as to activate said current-source circuit means in response to the potential of said current-source current determining signal.

13. A static-type semiconductor memory device as set forth in claim 12, further comprising word lines and hold lines, wherein each of said memory cells is connected between one of said word lines and one of said hold lines, said word lines and said hold lines extending in the row direction, said holding-current being conducted from each of said word lines through said memory cells to said hold lines, wherein each of said memory cells is operatively connected between a pair of bit lines extending in said column direction, and wherein said current control means comprises a plurality of first NPN transistors each having a nase operatively connected to said differential amplifier, for receiving said current control determining signal, having a collector connected to one of said hold lines, and having an emitter connected to a first power supply.

14. A static-type semiconductor memory device as set forth in claim 13, wherein said current-source circuit means comprises a second NPN transistor having a base operatively connected to receive said current-source current determining signal.

15. A static-type semiconductor memory device, operatively connected to receive a reference signal and a block selecting signal, as set forth in claim 14, wherein said differential amplifier comprises:
a third NPN transistor having a base operatively connected to receive the reference signal, having a collector operatively connected to a second power supply, and having an emitter;
a first resistor operatively connected between said second power supply and said collector of said third NPN transistor;
a current-source operatively connected to said emitter of said third NPN transistor;
a fourth NPN transistor having a base operatively connected to receive the block selecting signal, having a collector operatively connected to said second power supply, and having an emitter operatively connected to said current-source;
a second resistor operatively connected between said collector of said fourth NPN transistor and said second power supply; and
wherein said collector of said third NPN transistor provides said current control determining signal to said differential amplifier, and wherein said collector of said fourth NPN transistor provides said current-source current determining signal to said differential amplifier.

16. A static-type semiconductor memory device as set forth in claim 15, wherein each of said memory blocks is a memory chip.

17. A static-type semiconductor memory device as set forth in claim 16, wherein a predetermined number of said memory blocks comprise a memory chip.

* * * * *

UNITED STATES PATENT AND TRADEMARK OFFICE
CERTIFICATE OF CORRECTION

PATENT NO. : 4,604,729
DATED : AUGUST 5, 1986
INVENTOR(S) : MASAYOSHI KIMOTO

It is certified that error appears in the above-identified patent and that said Letters Patent is hereby corrected as shown below:

Col. 1, line 22, delete comma ","; and after "transistors" (second occurrence) insert --,--;
line 52, "the" (second occurrence) should be --a--.

Col. 4, line 50, "$Q_2$ Reference" should be --$Q_2$. A reference--.

Col. 6, line 37, delete "type" (second occurrence).

Col. 9, line 4, "block" should be --blocks--.

Col. 10, line 26, "nase" should be --base--.

Signed and Sealed this

Twenty-eighth Day of October, 1986

[SEAL]

*Attest:*

DONALD J. QUIGG

*Attesting Officer*    *Commissioner of Patents and Trademarks*